(12) United States Patent
Pavier et al.

(10) Patent No.: US 6,894,397 B2
(45) Date of Patent: May 17, 2005

(54) PLURAL SEMICONDUCTOR DEVICES IN MONOLITHIC FLIP CHIP

(75) Inventors: Mark Pavier, Guildford (GB); Tim Sammon, Helensburgh (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/260,148

(22) Filed: Sep. 27, 2002

(65) Prior Publication Data

US 2003/0062622 A1 Apr. 3, 2003

Related U.S. Application Data

(60) Provisional application No. 60/326,667, filed on Oct. 3, 2001.

(51) Int. Cl.$^7$ .......................... H01L 23/48; H01L 23/52; H01L 29/40
(52) U.S. Cl. ........................ 257/778; 257/713; 257/722
(58) Field of Search ................................. 257/713, 722, 257/778

(56) References Cited

U.S. PATENT DOCUMENTS

| | | | |
|---|---|---|---|
| 4,970,579 A | * 11/1990 | Arldt et al. | 257/718 |
| 5,578,841 A | 11/1996 | Vaszuez et al. | 257/220 |
| 5,578,869 A | 11/1996 | Hoffman et al. | 257/691 |
| 5,629,835 A | 5/1997 | Mahulikar et al. | 361/719 |
| 5,729,052 A | 3/1998 | Tonti et al. | 257/712 |
| 5,757,081 A | * 5/1998 | Chang et al. | 257/778 |
| 5,990,552 A | * 11/1999 | Xie et al. | 257/718 |
| 6,075,279 A | * 6/2000 | Andoh | 257/620 |
| 6,215,290 B1 | * 4/2001 | Yang et al. | 323/282 |

* cited by examiner

Primary Examiner—Howard Weiss
(74) Attorney, Agent, or Firm—Ostrolenk, Faber, Gerb & Soffen, LLP

(57) ABSTRACT

A flip chip structure contains laterally spaced semiconductor devices such as MOSFETs in a common chip. A deep trench isolates the devices. Contacts are connected to the source drain and gate electrode (or other electrodes) and are interconnected as required for a circuit function either within the chip or on the support board. Ball contacts are connected to the electrodes. The opposite surface of the chip to that in which the devices are formed receives a copper or other metal layer which is patterned to increase its area for heat exchange. The surface of the copper is coated with black oxide to increase its ability to radiate heat.

22 Claims, 4 Drawing Sheets

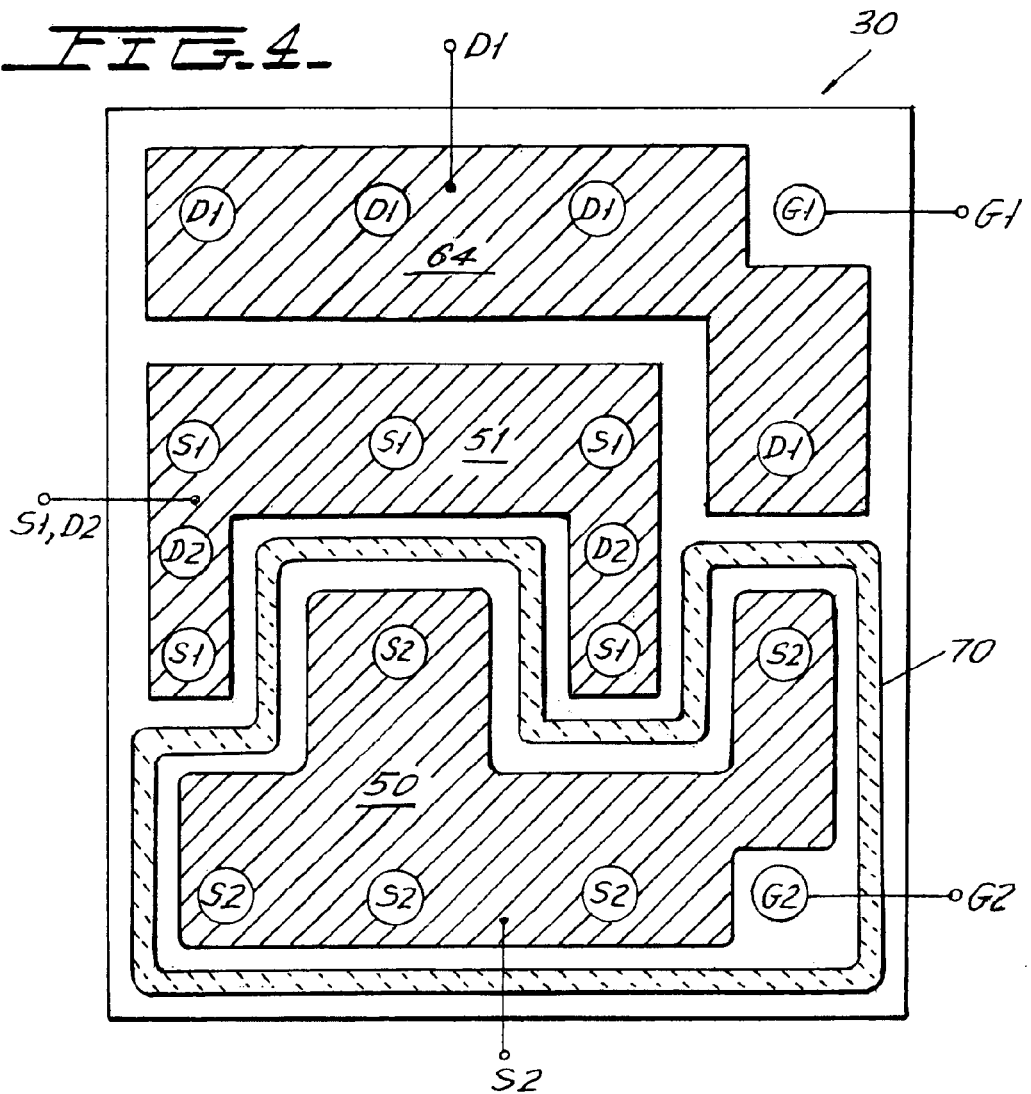
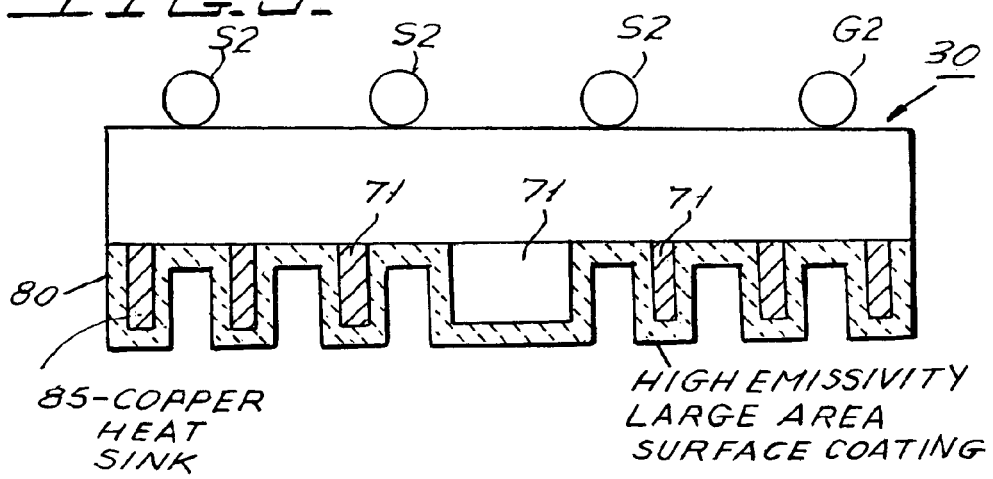

PLURAL SEMICONDUCTOR DEVICES IN MONOLITHIC FLIP CHIP

RELATED APPLICATION

This application claims the benefit of U.S. Provisional Application No. 60/326,667, filed Oct. 3, 2001.

FIELD OF THE INVENTION

This invention relates to semiconductor devices and more specifically relates to a single semiconductor chip having plural and interconnected semiconductor devices.

BACKGROUND OF THE INVENTION

Numerous circuits requiring multiple semiconductor chips are well known, such as dc to dc converters, half bridge arrangements and the like. The individual semiconductor devices for these circuits, which may include MOSFETs, bipolar transistors, diodes and the like may be formed in a flip chip configuration for mounting and interconnection in a printed circuit board with the other circuit components. Flip chip devices are shown in co-pending application Ser. No. 09/780,080, filed Feb. 9, 2001 entitled "VERTICAL CONDUCTION FLIP-CHIP DEVICE WITH BUMP CONTACTS ON A SINGLE SURFACE" in the name of Naresh Thapar (IR-1696), the disclosure of which is incorporated herein by reference. The need to mount the components separately on a support surface requires lateral space or area on the board. It would desirable to make these components so that they have the smallest possible "footprint" on the support board.

BRIEF DESCRIPTION OF THE INVENTION

In accordance with the present invention, plural semiconductor flip chip devices are formed in a single common semiconductor chip, and are laterally spaced from one another within the single chip and are physically insulated from one another by an isolation trench formed into the surface of the chip. Ball connectors or other contacts, as desired, are then formed on the top surface of the chip (the surface receiving the isolation trench) and the balls or contacts are clustered on common terminals of the devices to permit the desired interconnection of the device terminals either within the chip or on the mounting surface receiving the chip to form the desired circuits when they are mounted. The devices and circuits will then have a reduced footprint on the support board, and the integrated flip chip will have a lower cost than the separate plural flip chip devices.

BRIEF DESCRIPTION OF THE DRAWINGS

FIG. 4 is a top view of the chip of FIG. 2 in which common ball terminals are clustered for simplified connection to a support surface.

FIG. 5 shows the bottom surface of the device of FIG. 2, patterned for improved cooling and having a high thermal emissivity coating.

DETAILED DESCRIPTION OF THE PREFERRED EMBODIMENTS

Figure 1:
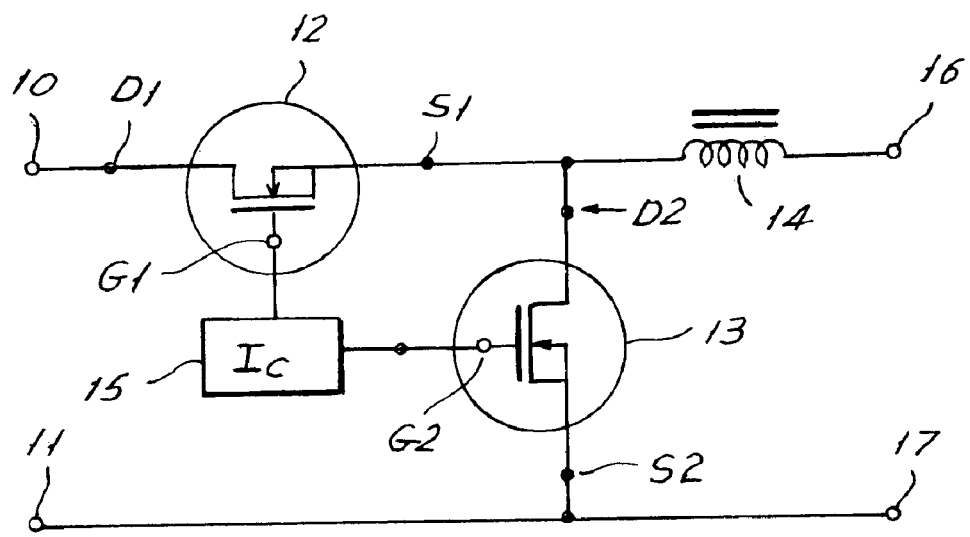
FIG. 1 is a circuit diagram of a typical synchronous buck converter circuit in which the semiconductor components can be implemented in accordance with the invention.

One circuit which can be implemented in accordance with the invention is a dc to dc converter as shown in FIG. 1. Other circuits can also be so implemented as will be apparent to those skilled in the art. The circuit of FIG. 1, commonly called a synchronous buck converter, comprises a pair of input d-c terminals 10 and 11, a MOSFET 12, frequently termed a control MOSFET, a second MOSFET 13, frequently termed a synchronous MOSFET and operated to act as a diode, an inductor 14, a control integrated circuit or IC 15 and a pair of output dc terminals 16 and 17. The IC 15 operates to turn control MOSFET 12 on and off with a duty cycle chosen and controlled to maintain a fixed output voltage at terminals 16 and 17. The synchronous MOSFET 13 is turned on when the control MOSFET 12 is off to provide a current path through inductor 14 when MOSFET 12 is off.

Components 12 and 13 are always implemented as separate devices, and sometimes as flip chip devices. When they are flip chip devices, they will usually have ball contacts for the source, drain and gate terminals S1, D1 and G1 respectively of MOSFET 12 and for the source, drain and gate terminals S2, D2 and G2 respectively of MOSFET 13 as shown in FIG. 1. The contact balls can be replaced by planar contacts if desired.

Figure 3:
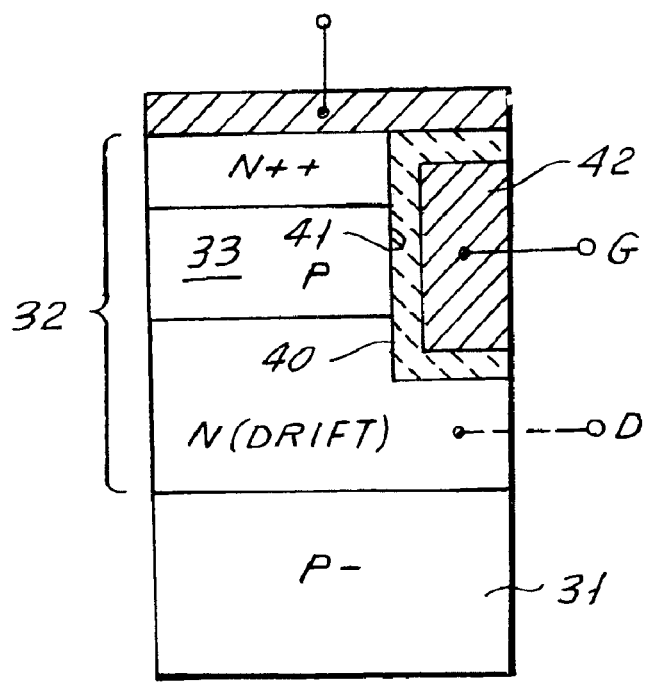
FIG. 3 is an enlarged view of one of the MOSFET cells of the devices of FIG. 2.
Figure 2:
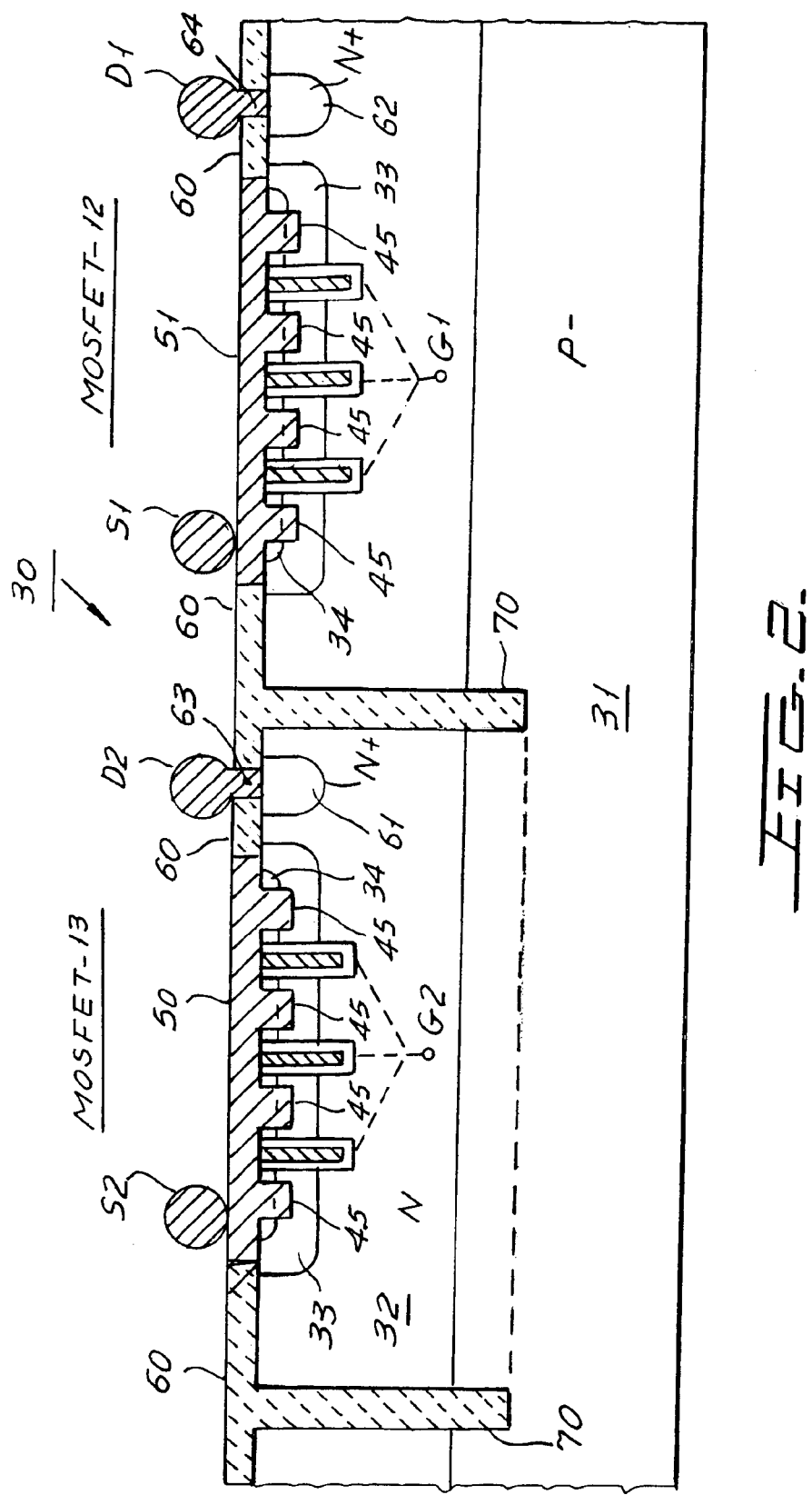
FIG. 2 is a cross-section of a monolithic chip containing the semiconductor devices of FIG. 1.

In accordance with the invention, MOSFETs 12 and 13 are implemented in a monolithic flip chip structure as shown in FIGS. 2, 3 and 4. It is to be noted that other similar circuits, such as, half bridges and circuits including parts other than all MOSFETs and including, for example, diodes, can also be implemented in accordance with the invention.

Referring to FIG. 2, there is shown a monolithic silicon chip 30 having a high resistively $P^-$ substrate 31 which has an epitaxially grown silicon $N^-$ layer 32 grown thereon. Substrate 31 may also be an insulation substrate of any desired type. Further, if substrate 31 is silicon, $N^-$ silicon would be chosen for P channel devices.

While in wafer form, a plurality of identical monolithic chips or die are simultaneously formed. Thus, a plurality of P type bases 33 are diffused into the top of the substrate, and $N^+$ source regions 34 are diffused into the P bases 33. A plurality of spaced gate trenches 41 are then etched into each of the P regions 33, as shown in FIG. 3 for one of the "cells" of FIG. 2. An oxide 40 is grown within trench 41 to define a vertical gate oxide region and a bottom oxide layer. Each of the trenches are then filled with a conductive polysilicon gate body 42. The gate body regions 42 within each of devices 12 and 13 are separately interconnected, defining insulated gates G1 and G2 respectively (FIG. 2).

Contact trenches 45 are then formed, as shown in FIG. 2, and conductive electrodes 50 and 51 are formed into trenches 45 and atop the silicon, connecting the sources 34 and bases 33 within the contact trenches 45. Note that an insulation oxide 60 is also provided as later described to separate the two devices. Further, $N^+$ contact regions 61 and 62 are provided, which receive drain contacts 63 and 64.

To complete the monolithic device, and, in accordance with the invention, a deep isolation trench 70 is formed around MOSFET 13 and is filled with oxide 60. Note that the trench could have been formed around MOSFET 12. Contact balls may then be formed on the device surface as shown in FIGS. 2, 4 and 5, in which spaced balls S1 and S2 are formed on source contacts 50 and 51; drain contacts D1 and D2 are formed on drain contacts 63 and 64 respectively; and gate balls G1 and G2 are connected to the device gates as desired.

In accordance with the invention, contact 51 is connected to both the source region 34 (balls S1) of device 12, and to drain region 61 (balls D2) of MOSFET 13, thus connecting the source of device 12 to the drain of device 13.

Balls S1 and D2 may be connected together by tracks on the circuit board receiving the device. Alternatively one could deposit a metal layer on the silicon to connect the source and drain regions, S1 and D2, together. This metalisation would bridge the isolation trench region on going from S1 to D2 and have to have suitable isolation from the drain region D1.

Thus, a monolithic flip chip which contains the MOSFETs 12 and 13 is formed. Note that other devices could have been implemented. For example, MOSFETs 12 and 13 could have been planar devices; or one planar and one trench device; and the device of FIGS. 2, 3 and 4 could also be formed as an integrated half bridge circuit. Junction isolation could also have been used.

FIG. 5 shows another feature of the invention in which the top free surface 70 of the monolithic chip of FIGS. 2 and 4 may have a novel heat sink structure (which can be used for any flip chip structure), in which a copper layer 71 which can operate as a heat sink is applied to the surface 70 as by clamping or adhesion or by deposition and is patterned to have plural spaced parallel slots therein. The patterned copper then has a high emissivity thermal layer 80, such as a black oxide formed thereon, to improve radiation cooling of the device. The central copper stripe 85 may be enlarged to define a large central area which cooperates with die pick and place equipment.

The copper heat sink 71 may be 100 to 400 microns thick (on a substrate which is 100 to 300 microns thick). The thick metal 71 therefore also acts to reinforce the silicon die.

The black oxide may be formed from an ammonia copper carbonate solution in contact with the copper 71 for from 30 seconds to 5 minutes; or by plating.

Figure 6:
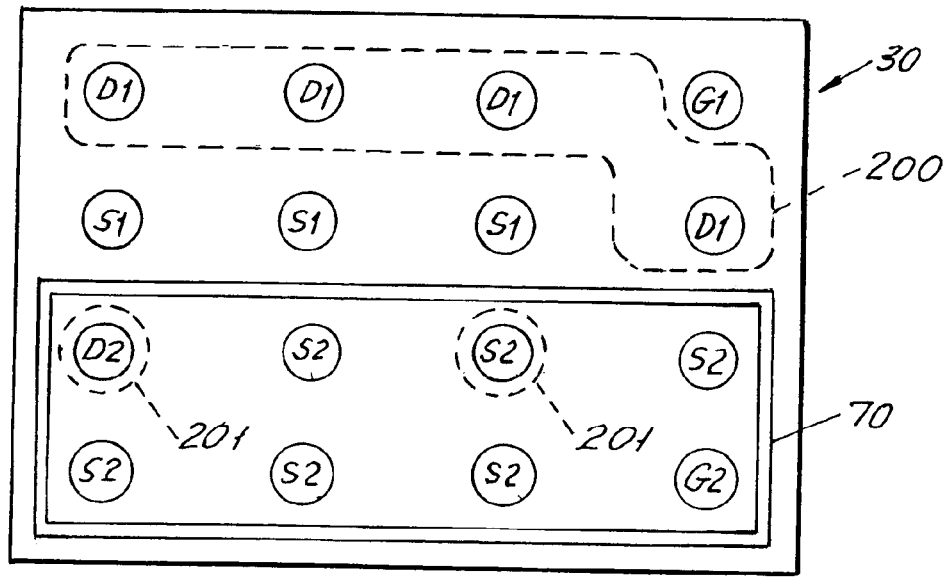
FIGS. 6 and 7 show second and third embodiments respectively of the layout of the solder balls of the device of FIG. 4.

FIG. 6 shows an alternative embodiment of FIG. 4 in which the drain, source and gate contacts are all interconnected as desired by conductive traces on the support substrate, such as a printed circuit board or other substrate. The dotted lines 200 and 201 indicate connections of the D1 and D2 contacts to the underlying substrate or drift region.

Figure 7:
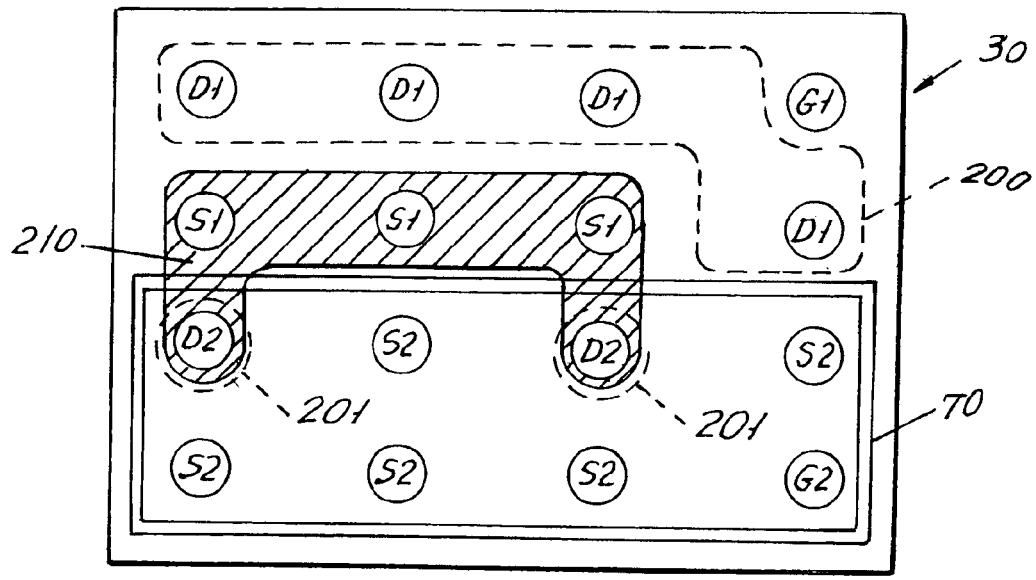

In FIG. 7, the S1 contacts are connected to the D2 contacts by conductive bridge 210. Note that bridge 210 will be suitably insulated from the silicon surfaces.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An integrated flip chip structure with top and bottom sides, comprising a single chip of silicon having a top junction receiving surface; a first and second semiconductor devices, each having a respective set of junction patterns and a respective set of terminal metals; said respective sets of junction patterns being formed in respective and laterally spaced areas of said top junction receiving surface; said respective sets of terminal metals for said first and second devices being laterally spaced from one another and being disposed atop said top junction receiving surface such that all of said terminal metals are accessed from the top side of said flip chip structure wherein said first and second semiconductor devices are MOSFET devices of a substantially similar junction pattern having respective source, drain and gate terminal metals.

2. The device of claim 1 which includes a deep isolation trench extending into said top junction receiving surface and enclosing said area containing only one of said first or second set of junction patterns.

3. The device of claim 1 wherein said terminal metals each include at least one respective contact ball.

4. The device of claim 3 wherein said device has five terminal connectors comprising a first terminal connector to the drain terminal metals of said first device, a second terminal connector connected to said source terminal metal of said second device; a third terminal connector connected to said source terminal metal of said first device and to said drain terminal metal of said second device; and fourth and fifth terminal connectors connected to said gates of said first and second devices respectively.

5. The device of claim 1 wherein said terminal metals each include a respective contact ball.

6. The device of claim 1 wherein said device has five terminal connectors comprising a first terminal connector to the drain terminal metal of said first device, a second terminal connector connected to said source terminal metals of said second device; a third terminal connector connected to said source terminal metal of said first device and to said drain terminal metal of said second device; and fourth and fifth terminal connectors connected to said gates of said first and second devices respectively.

7. The device of claim 6, wherein said device is connectable directly within a synchronous buck converter circuit.

8. The device of claim 6 wherein said terminal connectors comprise spaced metallized patterns on a support board which receives said integrated structure.

9. The device of claim 6 wherein the opposite surface of said chip from said top junction receiving surface has a metallized layer thereon; said metallized layer being patterned to define heat sink fins for improved cooling of said chip when said junction receiving surface of said chip is mounted on a support board.

10. The device of claim 6 wherein the opposite surface of said chip from said top junction receiving surface has a metallized layer thereon; and a high thermal emissivity layer on the outer surface of said metallized layer.

11. The device of claim 1 wherein the opposite surface of said chip from said top junction receiving surface has a metallized layer thereon; said metallized layer being patterned to define heat sink fins for improved cooling of said chip when said junction receiving surface of said chip is mounted on a support board.

12. The device of claim 1 wherein the opposite surface of said chip from said top junction receiving surface has a metallized layer thereon; and a high thermal emissivity layer on the outer surface of said metallized layer.

13. The device of claim 12 wherein said high emissivity layer is a black oxide.

14. A flip chip semiconductor device having opposite first and second surfaces and comprising first and second semiconductor devices each with a respective set of terminal contacts all accessed from the first surface for connection to a support surface; second surface having a metallized layer thereon; said metallized layer being patterned to define heat sink fins for improved cooling of said chip when said terminal contacts of said chip are mounted on a support board.

15. The device of claim 14 wherein said metallized layer is copper.

16. The device of claim 14 which further includes a high thermal emissivity layer on the surface of said metallized layer.

17. The device of claim 16 wherein said high emissivity layer is a black oxide.

18. The device of claim 17 wherein said metallized layer is copper.

19. A flip chip semiconductor device having opposite first and second surfaces and comprising first and second semiconductor devices each with a respective set of terminal contacts all accessed from the first surface for connection to a support surface; said second surface having and a metallized layer thereon; and a high thermal emissivity layer on the surface of said metallized layer.

20. The device of claim 19 wherein said high emissivity layer is a black oxide.

21. The device of claim 20 wherein said metallized layer is copper.

22. An integrated flip chip structure with top and bottom sides, comprising a single chip of silicon having a top junction receiving surface; a first and second semiconductor devices, each having a respective set of junction patterns and a respective set of terminal metals; said respective sets of junction patterns being formed in respective and laterally spaced areas of said top junction receiving surface; said respective sets of terminal metals for said first and second devices being laterally spaced from one another and being disposed atop said top junction receiving surface such that all of said terminal metals are accessed from the top side of said flip chip structure, wherein said device has five terminal connectors comprising a first terminal connector to a drain terminal metal of said first device, a second terminal connector connected to a source terminal metal of said second device; a third terminal connector connected to a source terminal metal of said first device and to a drain terminal metal of said second device; and fourth and fifth terminal connectors connected to gates of said first and second devices respectively.

* * * * *